Figure 1:
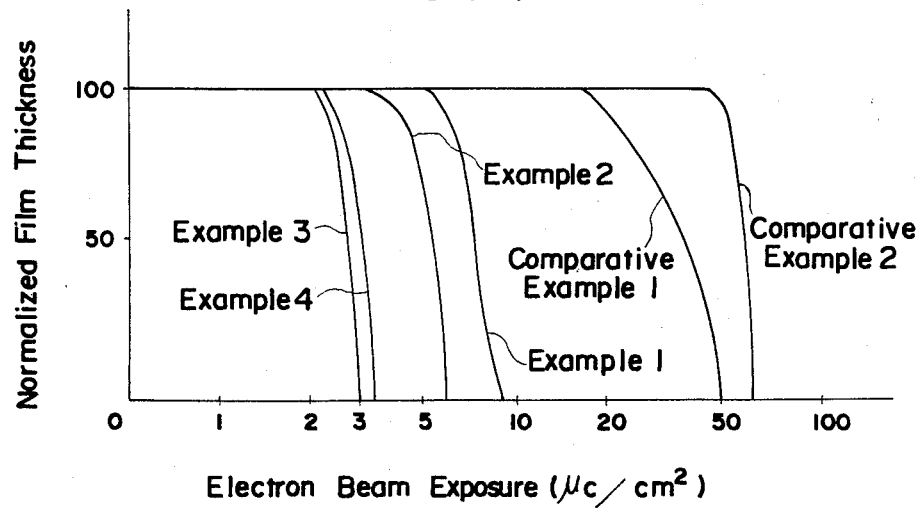

United States Patent

Tsuchiya et al.

[11] Patent Number: 4,751,168
[45] Date of Patent: Jun. 14, 1988

[54] NOVEL ELECTRON BEAM RESIST MATERIALS

[75] Inventors: Shozo Tsuchiya, Tokyo; Nobuo Aoki, Kawasaki, both of Japan

[73] Assignee: Nippon Oil Co., Ltd., Tokyo, Japan

[21] Appl. No.: 852,198

[22] Filed: Apr. 15, 1986

Related U.S. Application Data

[63] Continuation of Ser. No. 711,989, Mar. 14, 1985, abandoned.

[30] Foreign Application Priority Data

Mar. 19, 1984 [JP] Japan ............... 59-51144
Jul. 31, 1984 [JP] Japan ............... 59-158623
Jul. 31, 1984 [JP] Japan ............... 59-158624

[51] Int. Cl.$^4$ ............... C08G 75/22; G03C 1/495
[52] U.S. Cl. ............... 430/272; 428/421; 156/643; 430/296; 522/162; 528/364; 528/382; 525/451; 525/502
[58] Field of Search ............... 430/296, 272; 522/162

[56] References Cited

U.S. PATENT DOCUMENTS

| | | | |
|---|---|---|---|
| 3,313,785 | 4/1967 | Zutty | 528/386 |
| 3,893,127 | 7/1975 | Kaplan | 522/162 |
| 3,898,350 | 8/1975 | Gipstein | 522/162 |
| 3,932,369 | 1/1976 | Sartori | 528/386 |
| 4,289,845 | 9/1981 | Bowden | 430/296 |
| 4,409,317 | 10/1983 | Shiraishi | 430/296 |
| 4,421,843 | 12/1983 | Hattori | 430/296 |

Primary Examiner—John C. Bleutge
Assistant Examiner—Arthur H. Koeckert
Attorney, Agent, or Firm—Bucknam and Archer

[57] ABSTRACT

Positive acting electron beam resist materials are described. The material comprises a polymer having fundamental units of the general formula

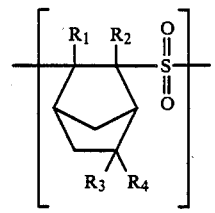

in which $R_1$, $R_2$ and $R_3$ independently represent hydrogen or a hydrocarbon group having from 1 to 6 carbon atoms, and $R_4$ represents an organic residue having from 1 to 20 carbon atoms. The polymer may be used, as the resist material, as it is or by mixing with other type of resin.

3 Claims, 1 Drawing Sheet

NOVEL ELECTRON BEAM RESIST MATERIALS

This is a continuation of application Ser. No. 711,989, filed Mar. 14, 1985, now abandoned.

DESCRIPTION

This invention relates to electron beam positive resist materials which have high sensitivity to radiations such as electron radiations and X-rays, high resolution, and good dry etching durability.

Electron beam resists adapted to make semiconductor elements such as IC and LSI should meet the following requirements.

(1) High sensitivity to electron beams.
(2) High resolution.
(3) Good dry etching durability.

A great number of electron beam resist materials have been heretofore proposed, but no materials, ever developed, are considered to satisfy all the requirements mentioned above. Accordingly, there is a high demand, in the electronic industries, for electron beam resist materials which have high performance and are appropriately used in practical resist-forming processes. As to the choice between positive and negative acting resists, positive active resists which are more likely to yield high resolution are especially preferred because of the recent increasing tendency toward the fineness of image.

Representative of hitherto developed positive acting electron beam resists are polybutene-1-sulfone (PBS) and polymethyl methacrylate (PMMA). Although the PBS resin has very high sensitivity, it is poor in dry etching resistance and is not so high in resolution. In other words, the requirements (2) and (3) are not satisfied. On the other hand, the PMMA resin has high resolution, but has low sensitivity and poor dry etching durability. Thus, the requirements (1) and (3) are not satisfied.

Polynorbornenesulfone (PNS) has been recently developed as a positive acting resist material which overcomes the drawback of the poor dry etching resistance, common to both PBS and PMMA resins. However, this PNS resin is low in both sensitivity and resolution. The requirements (1) and (2) are not thus satisfied. In this sense, the PNS resin is not considered as a resist material which is satisfactorily utilized in practical applications.

An object of the invention is to provide positive acting electron beam resist materials which meet all the requirements (1) through (3), i.e. the materials have good dry etching durability, and high sensitivity and resolution.

The above object can be achieved by a positive active electron beam resist material which comprises a polymer having, in the molecule thereof, fundamental units of the general formula,

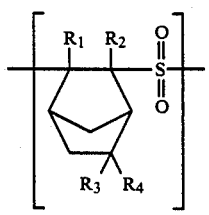

in which $R_1$, $R_2$ and $R_3$ independently represent hydrogen or a hydrocarbon residue having from 1 to 6 carbon atoms, and $R_4$ represents an organic residue having from 1 to 20 carbon atoms and selected from a hydrocarbon group, a partially or wholly fluorinated hydrocarbon, —$OR_5$ group wherein $R_5$ is hydrogen, a hydrocarbon group having from 1 to 8 carbon atoms, or a partially or wholly fluorinated hydrocarbon group having from 1 to 8 carbon atoms,

wherein $R_5$ has the same meaning as defined above, and

wherein $R_5$ has the same meaning as defined above.

The polymers of the above formula are obtained by copolymerizing compounds of the general formula (A) and $SO_2$ under conditions described hereinafter:

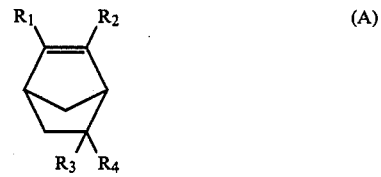

in which $R_1$ through $R_4$ have the same meanings as defined above, respectively.

The compounds of the formula (A) are typically obtained from cyclopentadiene and $\alpha,\beta$-unsaturated compounds by the Diels-Alder reaction. The $\alpha,\beta$-unsaturated compounds serve as so-called dienophiles in the Diels-Alder reaction.

In the reaction, cyclopentadiene derivatives such as methylcyclopentadiene may also be used instead of cyclopentadiene.

A number of $\alpha,\beta$-unsaturated compounds which are reacted with cyclopentadiene or derivatives thereof are used in the practice of the invention. Examples of the $\alpha,\beta$-compounds are compounds of the following formulae (B$_1$) and (B$_2$),

in which each $R_4$ has the same meaning as defined before, and include (1) monoethylenically unsaturated hydrocarbon compounds or partially or wholly fluorinated hydrocarbon compounds having from 1 to 20 carbon atoms; (2) vinyl alkyl ethers of the formula, $CH_2=CHOR_5$, in which $R_5$ has the same meaning as defined before; (3) esters of carboxylic acids such as vinyl esters of carboxylic acids and isopropenyl esters of carboxylic acids; and (4) acrylic and methacrylic acid esters.

More particularly, when monoethylenically unsaturated compounds (1) of the formulae (B$_1$) and (B$_2$) in which $R_4$ represents hydrocarbon compounds or partially or wholly fluorinated hydrocarbon compounds having from 1 to 20 carbon atoms, are reacted with cyclopentadiene or methylpentadiene, the compounds of the following formulae (A₁) through (A₄) are obtained:

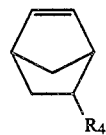
(A₁)

(A₂)

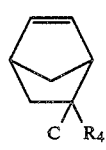
(A₃)

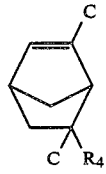
(A₄)

Likewise, the reaction between vinyl alkyl ethers (2) in which $R_4$ in the formulae (B₁) and (B₂) represents —OR₅ and cyclopentadiene or methylcyclopentadiene results in formation of compounds (A₅) through (A₈)

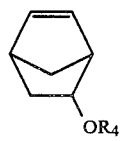
(A₅)

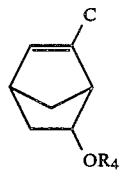
(A₆)

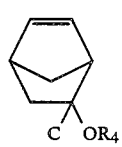
(A₇)

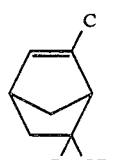
(A₈)

The reaction between esters of carboxylic acids such as vinyl esters of carboxylic acids or isopropenyl esters of carboxylic acids (3) and cyclopentadiene or its derivatives is capable of yielding compounds of the formulae (A₉) through (A₁₂)

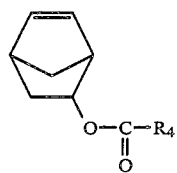
(A₉)

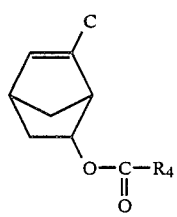
(A₁₀)

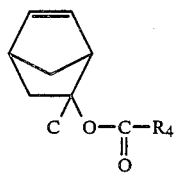
(A₁₁)

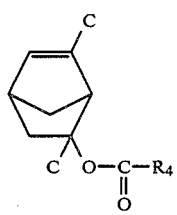
(A₁₂)

Moreover, the reaction between acrylic or methacrylic acid esters (4) and cyclopentadiene or its derivatives results in compounds of the formulae (A₁₃) through (A₁₆).

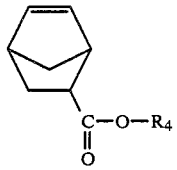
(A₁₃)

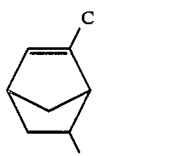
(A₁₄)

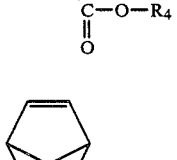
(A₁₅)

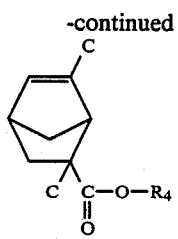
(A₁₆)

All the compounds of the formulae (A₁) through (A₁₆) are favorably used in the practice of the invention though all other compounds as defined in the formula (A) may be likewise prepared and used.

It will be noted that specific and, in fact, preferable examples of the compounds (1) through (4) are particularly described in Synthetic Examples appearing hereinafter.

The copolymerization of compound of the formula (A) and SO₂ is generally conducted in the presence of a catalyst for radical polymerization at a temperature from $-100°$ C. to $100°$ C., preferably from $-50°$ C. to $0°$ C. For the copolymerization, other monomers may coexist in the reaction system. Such monomers should have olefinic carbon-carbon double bonds therein and from 2 to 20 carbon atoms. Examples of these olefins include ethylene, propylene, butene, pentene, hexene, cyclopentene, styrene and mixtures thereof. These olefins are preferably used in an amount not greater than 50 wt% of the compound of the formula (A). If these olefins are used in combination, the resulting copolymer has olefin-SO₂— units in part of the molecule thereof.

The copolymers of the present invention belong to so-called polysulfone. Accordingly, other methods of the synthetic methods of polysulfone may be used to prepare the copolymer such as, for example, by oxidation of polysulfides.

The copolymers useful in the present invention have a number average molecular weight of from 10,000 to 1,000,000, preferably from 30,000 to 500,000.

The resist material of the invention may comprise, aside from the copolymer, other organic materials. Examples of the organic materials include novolac-type phenolic resins, resol-type phenolic resins, epoxy resins, and petroleum resins. These resin materials should preferably be used in amounts not greater than 50 wt% of the copolymer.

The copolymers used in the present invention are soluble in solvents such as chloroform, cyclohexanone, tetrahydrofuran, and dioxane.

When applied as a resist, the copolymer is dissolved in a solvent to obtain a solution having a concentration of from 3 to 40 wt%, preferably from 5 to 20 wt%.

The solution is usually applied to a substrate by a spinner. After completion of the application, the applied substrate may be preheated, if necessary. The heating temperature is from 100° to 200° C., preferably from 140° to 160° C.

The substrate on which the positive acting resist has been coated is exposed to electron beams by any ordinary manner, and the resist in portions where exposed is decomposed.

The developer used after the exposure to electron beams may be mixtures of good solvents such as chloroform, cyclohexanone, tetrahydrofuran or dioxane, and poor solvents such as ethanol, isopropanol or toluene in suitable mixing ratios.

The resist materials of the invention have a dry etching durability equal to PNS, and have higher sensitivity and resolution than PNS. We believe that these higher characteristics are ascribed to the introduction of the specific types of side chains into the molecular structure of the copolymers. In other words, the introduction of the substituent, R₄, is considered to make a greater difference in solubility in solvent between exposed and unexposed portions.

FIG. 1 shows the high sensitivity of the fluorinated hydrocarbon-substituted polynorbornene sulfone polymer compared with polynorbornene sulfone and with polymethyl methacrylate.

Figure 2:
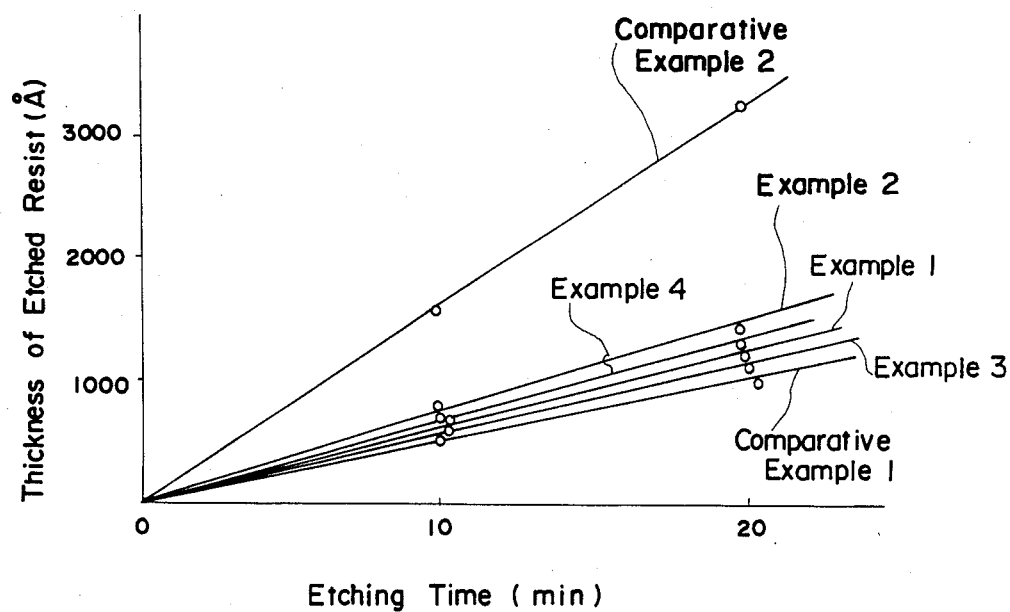

FIG. 2 compares etched resist thickness with plasma etching time for the same materials.

The present invention is described in more detail by way of examples and comparative examples.

SYNTHETIC EXAMPLE 1

Synthesis of Polymer I

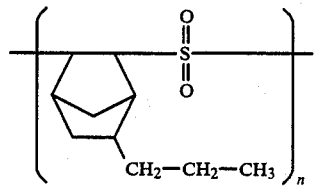

The Diels-Alder reaction between cyclopentadiene and 1-pentene was carried out at 30° C. to obtain, in a yield of 90%, compound (1) of the formula

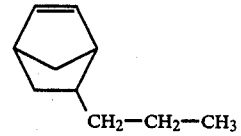

68 g (0.5 mol) of the compound (1) and 0.45 g (0.005 mol) of t-butylhydroperoxide were dissolved in 1000 ml of cyclohexanone and charged into a 2 liter flask equipped with an agitator. While cooling the flask in a low temperature bath, the content was agitated so that the inner temperature was maintained at −20° C., followed by blowing 32 g (0.50 mol) of sulfur dioxide portion by portion for polymerization. After polymerization at −20° C. for 1 hour, the resulting polymer solution was dropped into 10 liters of methanol, whereupon a white precipitate was produced. The precipitate was dissolved in chloroform and re-precipitated in methanol for purification. The resulting precipitate was dried at 50° C. for 24 hours under reduced pressure to obtain 82 g of the precipitate (yield 82%).

The elementary, NMR and IR analyses revealed that the precipitate was a 1:1 alternating copolymer of compound (1) and sulfur dioxide. The molecular weight of the copolymer was determined by the GPC analysis using polystyrene as a reference, with the result that $Mn = 5.0 \times 10^4$ and $Mw = 14.8 \times 10^4$.

SYNTHETIC EXAMPLE 2

Synthesis of Polymer II

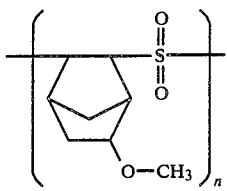

Vinyl methyl ether and cyclopentadiene were subjected to the Diels-Alder reaction to obtain compound (2) of the following formula

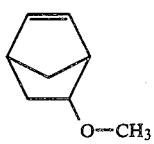

Subsequently, a 1:1 alternating copolymer of compound (2) and sulfur dioxide was prepared in the same manner as in Synthetic Example 1. Mn: $7.1 \times 10^4$, Mw: $16.2 \times 10^4$.

SYNTHETIC EXAMPLE 3

Synthesis of Polymer III

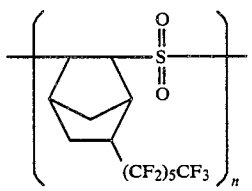

Compound (3) of the following formula was prepared by the Diels-Alder reaction between perfluorohexylethylene and cyclopentadiene

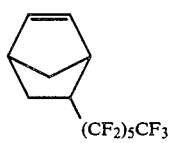

Subsequently, a 1:1 alternating copolymer of compound (3) and sulfur dioxide was prepared in the same manner as in Synthetic Example 1. Mn: $7.1 \times 10^4$, Mw: $13.4 \times 10^4$.

SYNTHETIC EXAMPLE 4

Synthesis of Polymer IV

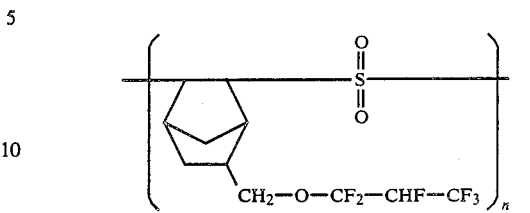

Compound (4) of the following formula was prepared by the Diels-Alder reaction between 2-hydroperfluoropropyl allyl ether and cyclopentadiene

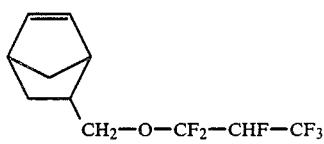

Thereafter, a 1:1 alternating copolymer of compound (4) and sulfur dioxide was prepared in the same manner as in Synthetic Example 1. Mn: $4.5 \times 10^4$, Mw: $9.2 \times 10^4$.

COMPARATIVE SYNTHETIC EXAMPLE 1

Synthesis of Polynorbornenesulfone (PNS)

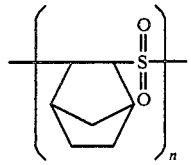

PNS was prepared from norbornene and sulfur dioxide in the same manner as in Synthetic Example 1. Mn: $16.9 \times 10^4$, Mw: $147 \times 10^4$.

COMPARATIVE SYNTHETIC EXAMPLE 2

Polymethylmethacrylate solution commercially available under the designation of Resist Solution OEBR-1000 (Tokyo Ohka Co., Ltd.) was provided for use in Comparative Example.

SYNTHETIC EXAMPLE 5

Synthesis of Polymer V

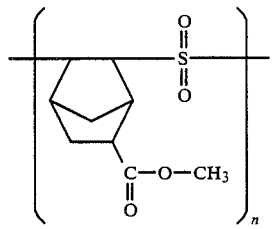

The Diels-Alder reaction between cyclopentadiene and methyl acrylate was conducted at 30° C. to obtain compound (5) of the following formula in a yield of 90%.

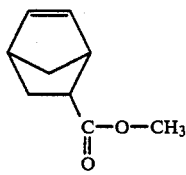

76 g (0.5 mol) of compound (5) and 0.45 mol (0.005 mol) of t-butylhydroperoxide were dissolved in 1000 ml of cyclohexanone and charged into a 2 liter flask equipped with an agitator. While cooling the flask in a low temperature bath, the content was agitated so that the inner temperature was maintained at $-20°$ C., followed by blowing 32 g (0.50 mol) of sulfur dioxide, portion by portion, for polymerization. After polymerization at $-20°$ C. for 1 hour, the resulting polymer solution was dropped into 10 liters of methanol, whereupon white precipitate was produced. The precipitate was dissolved in chloroform and re-precipitated in methanol for purification. The resulting precipitate was dried at 50° C. for 24 hours under reduced pressure to obtain 80 g of the precipitate (yield 74%).

The elementary, NMR and IR analyses revealed that the precipitate was a 1:1 alternating copolymer of compound (5) and sulfur dioxide. The molecular weight of the copolymer was determined by the GPC analysis using polystyrene as a reference, with the result that $Mn = 4.6 \times 10^4$ and $Mw = 14.0 \times 10^4$.

SYNTHETIC EXAMPLE 6

Synthesis of Polymer VI

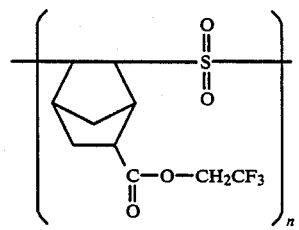

The Diels-Alder reaction between 2,2,2-trifluoroethyl acrylate and cyclopentadiene was conducted to obtain compound (6) of the following formula

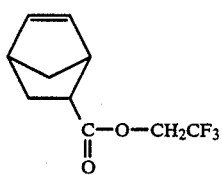

Thereafter, a 1:1 alternating copolymer of compound (6) and sulfur dioxide was prepared in the same manner as in Synthetic Example 5. Mn: $8.2 \times 10^4$, Mw: $12.6 \times 10^4$.

SYNTHETIC EXAMPLE 7

Synthesis of Polymer VII

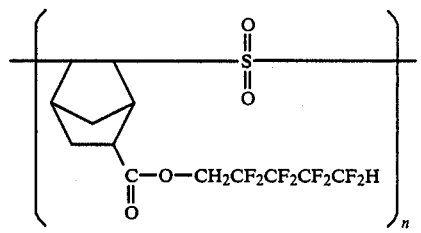

The Diels-Alder reaction between an ester of 2,2,3,3,4,4,5,5-octafluoropentanol with acrylic acid and cyclopentadiene was conducted to obtain compound (7) of the following formula

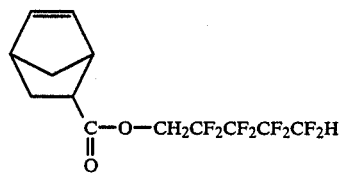

Thereafter, a 1:1 alternating copolymer of compound (7) and sulfur dioxide was prepared in the same manner as in Synthetic Example 5. Mn: $3.5 \times 10^4$, Mw: $8.0 \times 10^4$.

SYNTHETIC EXAMPLE 8

Synthesis of Polymer VIII

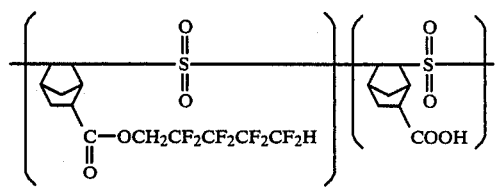

First, acrylic acid and cyclopentadiene were subjected to the Diels-Alder reaction to obtain compound (8) of the following formula

Thereafter, a mixture of compound (7) obtained in Synthetic Example 7 and compound (8) in a ratio of 10:1 were reacted with sulfur dioxide to obtain a terpolymer of compounds (7), (8) and sulfur dioxide. Mn: $3.4 \times 10^4$, Mw: $7.5 \times 10^4$.

SYNTHETIC EXAMPLE 9

Synthesis of Polymer IX

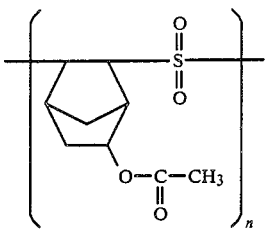

The Diels-Alder reaction between cyclopentadiene and vinyl acetate acrylate was conducted at 30° C. to obtain compound (9) of the following formula in a yield of 92%.

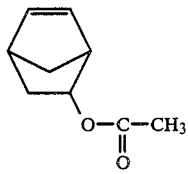

76 g (0.5 mol) of compound (9) and 0.45 mol (0.005 mol) of t-butylhydroperoxide were dissolved in 1000 ml of cyclohexanone and charged into a 2 liter flask equipped with an agitator. While cooling the flask in a low temperature bath, the content was agitated so that the inner temperature was maintained at −20° C., followed by blowing 32 g (0.50 mol) of sulfur dioxide, portion by portion, for polymerization. After polymerization at −20° C. for 1 hour, the resulting polymer oil was dropped into 10 liters of methanol, whereupon white precipitate was produced. The precipitate was dissolved in chloroform and re-precipitated in methanol for purification. The resulting precipitate was dried at 50° C. for 24 hours under reduced pressure to obtain 82 g of the precipitate (yield 75%).

The elementary, NMR and IR analyses revealed that the precipitate was a 1:1 alternating copolymer of compound (9) and sulfur dioxide. The molecular weight of the copolymer was determined by the GPC analysis using polystyrene as a reference, with the result that $Mn = 4.8 \times 10^4$ and $Mw = 15.0 \times 10^4$.

SYNTHETIC EXAMPLE 10

Synthesis of Polymer X

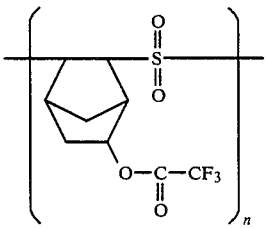

First, vinyl trifluoroacetate and cyclopentadiene were subjected to the Diels-Alder reaction to obtain compound (10) of the following formula

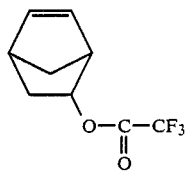

Thereafter, a 1:1 alternating copolymer of the compound (10) and sulfur dioxide was prepared in the same manner as in Example 9. Mn: $8.4 \times 10^4$, Mw: $12.8 \times 10^4$.

SYNTHETIC EXAMPLE 11

Synthesis of Polymer XI

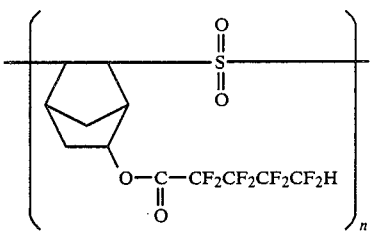

First, vinyl 2,2,3,3,4,4,5,5-octafluorovalerate and cyclopentadiene were subjected to the Diels-Alder reaction to obtain compound (11) of the following formula

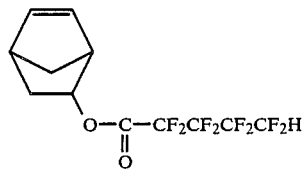

Thereafter, a 1:1 alternating copolymer of the compound (11) and sulfur dioxide was prepared in the same manner as in Example 9. Mn: $3.6 \times 10^4$, Mw: $8.2 \times 10^4$.

EXAMPLES 1-11 AND COMPARATIVE EXAMPLES 1-2

Copolymers I through XI obtained in Synthetic Examples 1 through 11, and the PNS obtained in Comparative Synthetic Example 1 were each dissolved in cyclohexanone to obtain a 10 wt% solution. These solutions and the commercially sold PMMA resist solution OEBR-1000 were each applied onto a silicon wafer in a thickness of about 0.5 μm by the use of a spinner. Subsequently, the applied wafers were preheated in a nitrogen-substituted thermostatic chamber at a temperature of 160° C. for 1 hour.

An electron beam resist-assessing apparatus ERE-301 (ELIONIX Co., Ltd.) using electron beam exposure was provided to evaluate the respective resists under conditions of an acceleration voltage of 20 KV. After exposure, the respective resists were developed using a developer which was selected depending on the type of resist material, and a change in thickness of each resist was measured. In view of the relation between the exposure and the thickness, a characteristic curve was drawn to determine the sensitivity and contrast (an indicator of resolution, better at higher contrast) of each resist.

The plasma etching resistance of each film was evaluated as follows: a plasma reactor PR-501 (Yamato Scientific Co., Ltd.) was used and the resistance to CF$_4$ plasma was assessed in terms of a reduction speed of the film thickness per unit time.

The results of the evaluations are shown in Table below. The results of the resists obtained from the copolymers of Examples 1 through 4 and the materials from Comparative Examples 1 and 2 are shown in FIGS. 1 and 2 since the other copolymers of the invention are similar in results to those of Examples 1 through 4. FIG. 1 shows a graphical representation of the relation between film thickness and electron beam exposure for the resists of Examples 1 through 4 in comparison with the resists of Comparative Examples 1 and 2. FIG. 2 is a graphical representation of the relation between etched resist thickness and plasma etching time for inventive and comparative resists.

TABLE

| | | | Resist Performances | | |
|---|---|---|---|---|---|
| Ex. No. | Resist Material | Developer Composition (time: 3 min.) | Sensitivity ($\mu c/cm^2$) | Contrast | CF$_4$ Plasma Etching Speed (angstrom/min) |
| 1 | Polymer I | tetrahydrofuran/methanol = 7/3 | 9.1 | 3.5 | 60 |
| 2 | Polymer II | tetrahydrofuran/methanol = 6/4 | 6.6 | 3.6 | 68 |
| 3 | Polymer III | tetrahydrofuran/methanol = 3/7 | 3.2 | 5.1 | 54 |
| 4 | Polymer IV | tetrahydrofuran/methanol = 3/7 | 3.6 | 5.1 | 64 |
| 5 | Polymer V | tetrahydrofuran/methanol = 7/3 | 9.0 | 3.4 | 60 |
| 6 | Polymer VI | tetrahydrofuran/methanol = 1/9 | 6.5 | 3.5 | 70 |
| 7 | Polymer VII | tetrahydrofuran/isopropanol = 1/9 | 3.0 | 5.0 | 55 |
| 8 | Polymer VIII | methanol/isopropanol = 1/9 | 3.5 | 4.0 | 57 |
| 9 | Polymer IX | tetrahydrofuran/methanol = 7/3 | 8.9 | 3.4 | 59 |
| 10 | Polymer X | tetrahydrofuran/methanol = 1/9 | 6.4 | 3.5 | 69 |
| 11 | Polymer XI | methanol/isopropanol = 1/9 | 2.9 | 5.0 | 54 |
| Com. Ex. 1 | PNS | tetrahydrofuran/methanol = 7/3 | 50 | 1.8 | 50 |
| Com. Ex. 2 | PMMA | methyl isobutyl ketone/isopropanol = 1/3 | 65 | 5.5 | 160 |

The resists of the polymers I through XI of the invention exhibit almost the same dry-etching durability as the PNS resist and have higher sensitivity. The contrast of the resists of Examples 1 through 11 are higher than the contrast of the PNS resist of Comparative Example 1. Thus, the resists of the invention have high resolution. The PMMA resist of Comparative example 2 exhibits high resolution, but are low in sensitivity and poor in etching durability.

What is claimed is:

1. A positive active electron beam resist material which comprises a silicon wafer and a polymer having a number average molecular weight of from 10,000 to 1,000,000 and having, in the molecule thereof, repeating fundamental units of formula

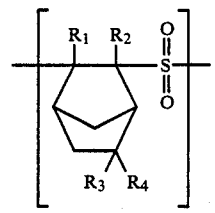

wherein each of $R_1$, $R_2$ and $R_3$ is hydrogen or a hydrocarbon radical having from 1 to 6 carbon atoms, and $R_4$ is (a) a partially or completely fluorinated hydrocarbon radical having from 1 to 20 carbon atoms; (b) a —$OR_5$ group wherein $R_5$ is a partially or completely fluorinated hydrocarbon radical having from 1 to 8 carbon atoms; (c) a

group wherein $R_5$ has the same meaning as defined above; or (d) a

group wherein $R_5$ has the same meaning as defined above.

2. The resist material according to claim 1 wherein said polymer is a member selected from the group of

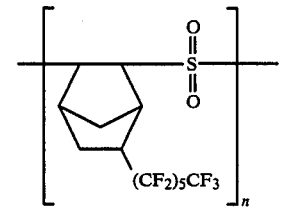

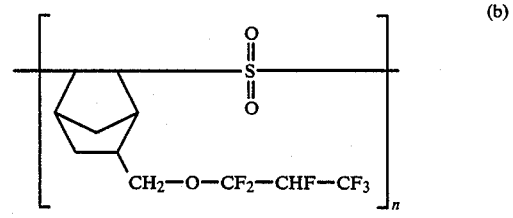

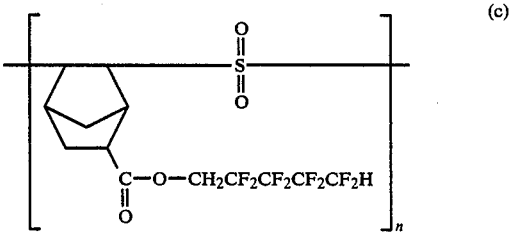

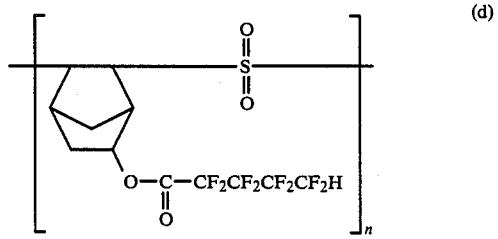

3. The resist material according to claim 1, additionally comprising up to 50 wt%, based on the weight of said polymer, of a phenolic resin.

* * * * *